US 8,095,351 B2

(12) United States Patent
Suwada et al.

(10) Patent No.: US 8,095,351 B2
(45) Date of Patent: Jan. 10, 2012

(54) MODELING METHOD, APPARATUS, AND COMPUTER READABLE MEDIUM FOR CREATING THREE-DIMENSIONAL ANALYSIS MODEL OF A TARGET OBJECT TO ANALYZE DATA TRANSMISSION

(75) Inventors: Makoto Suwada, Kawasaki (JP); Akio Sekino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/896,639

(22) Filed: Sep. 4, 2007

(65) Prior Publication Data
US 2008/0133185 A1    Jun. 5, 2008

Related U.S. Application Data

(63) Continuation of application No. PCT/JP2005/005153, filed on Mar. 22, 2005.

(51) Int. Cl.
*G06F 17/50* (2006.01)
*G06G 7/56* (2006.01)
*G06G 7/62* (2006.01)

(52) U.S. Cl. ................. 703/14; 703/5; 703/13
(58) Field of Classification Search ............ 703/1, 5, 703/13, 14
See application file for complete search history.

(56) References Cited

U.S. PATENT DOCUMENTS

| 6,374,205 B1 * | 4/2002 | Kuribayashi et al. ......... 703/14 |
| 6,711,511 B2 * | 3/2004 | Nagase et al. ................ 702/65 |
| 7,206,731 B2 * | 4/2007 | Sercu et al. .................. 703/14 |
| 7,289,945 B2 * | 10/2007 | Jiao et al. .................... 703/14 |
| 2002/0007261 A1 * | 1/2002 | Ochi et al. ................... 703/14 |
| 2002/0019713 A1 * | 2/2002 | Nagase et al. ................ 702/66 |
| 2003/0204343 A1 | 10/2003 | Yamamoto et al. |

FOREIGN PATENT DOCUMENTS

| JP | 7-302258 A | 11/1995 |
| JP | 10-124567 A | 5/1998 |
| JP | 2002-90403 | 3/2002 |
| JP | 2002-288241 | 10/2002 |
| JP | 2004-4054 | 1/2004 |

OTHER PUBLICATIONS

Written Opinion of the International Search Authority, PCT/ISA/237 for PCT/JP2005/005153, English translation.*
Tosaka et al, "Line Noise Analysis System "SIGNAL" for Gigahertz Transmission", Fujitsu, vol. 51, No. 5, pp. 297-302, 2000.*

(Continued)

*Primary Examiner* — Paul Rodriguez
*Assistant Examiner* — Nithya Janakiraman
(74) *Attorney, Agent, or Firm* — Fujitsu Patent Center

(57) ABSTRACT

A modeling method creates a three-dimensional analysis model of a target object for extracting parameters that are used to analyze a high-frequency transmission, by selecting, from an art work data of the target object, an extraction target region that becomes a target for extracting the parameters that are used to analyze the high-frequency transmission, deleting non-extraction target elements of the extraction target region, that do not affect an electromagnetic analysis and are other than extraction target elements that affect the electromagnetic analysis, linearizing, from among the extraction target elements, a curved wiring, and optimizing a wiring length of the extraction target region including the linearized wiring and optimizing an analyzing space dimension of the extraction target region, so as to create the three-dimensional analysis model.

17 Claims, 10 Drawing Sheets

OTHER PUBLICATIONS

"Analog Small-Signal Modeling—Part I: Behavioral Signal Path Modeling for Analog Integrated Circuits", by Leyn et al. 2001 IEEE.*

Takehiro Takahashi, et al., "EMC Simulation", *The Journal of the Institute of Electronics, Information and Communication Engineers*, vol. 83, No. 11, Nov. 25, 2000, pp. 851-855.

International Search Report (Form PCT/ISA/210) of the International application No. PCT/JP2005/005153 (mailed on May 24, 2005).

Japanese Notice of Reason(s) for Rejection, Partial English-language Translation, mailed Mar. 8, 2011 for corresponding Japanese Application No. 2007-509110.

* cited by examiner

MODELING METHOD, APPARATUS, AND COMPUTER READABLE MEDIUM FOR CREATING THREE-DIMENSIONAL ANALYSIS MODEL OF A TARGET OBJECT TO ANALYZE DATA TRANSMISSION

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2005/005153 filed Mar. 22, 2005, in the Japanese Patent Office, the disclosure of which is hereby incorporated by reference.

BACKGROUND OF THE INVENTION

1. Field of the Invention

The present invention generally relates to modeling methods and apparatuses and computer-readable storage media, and more particularly to a modeling method and a modeling apparatus that create a three-dimensional analysis model for extracting, from an art work data, parameters that are used to analyze high-frequency transmission, and to a computer-readable storage medium that stores a program for causing a computer to create such a three-dimensional analysis model.

2. Description of the Related Art

When carrying out a high-precision simulation in the over-GHz-class high-frequency range based on the art data that includes wirings, layouts of elements and the like of the printed circuit board or the like, frequency-dependent parameters of vias and pads become necessary. The S-parameters and the like in which the amplitude (dB) and the phase (or the real part and the imaginary part) are written for each frequency, may be used as the frequency-dependent parameters. The S-parameters of the vias and the pads are extracted from the three-dimensional shapes of the via and pad portions in the art work data of the printed circuit board, using an electromagnetic analyzing solver. Since virtually all of the wirings that are drawn out from the vias and the pads in the art work data are curved, an extremely complicated wiring shape model is obtained if the curved wirings are used as they are to create the wiring shape model.

A method of computing the electromagnetic intensity by segmenting a metal housing of the electrical circuit device or the like into rectangular meshes that are suited for the current computation according to the moment technique, is proposed in a Japanese Laid-Open Patent Application No. 2002-288241, for example.

When making the electromagnetic analysis, the space is segmented into the meshes. But as described above, virtually all of the wirings that are drawn out from the vias and the pads in the art work data are curved wirings, and the wirings have extremely complicated shapes. For this reason, a large number of micromeshes, that cause a considerable increase in the analysis time, are generated, and there was a problem in that it takes an extremely long time to extract the parameters, such as the S-parameters, that are used to analyze the high-frequency transmission.

In addition, in order to extract the parameters that are used to analyze the high-frequency transmission, it is necessary to optimize the analyzing space, the wiring shape and the wiring length. However, there was a problem in that it takes an extremely long time to acquire the know-how for creating the analysis model and to carry out the operation of creating the analysis model.

SUMMARY OF THE INVENTION

Accordingly, it is a general object of the present invention to provide a novel and useful modeling method and apparatus and computer-readable storage medium, in which the problems described above are suppressed.

Another and more specific object of the present invention is to provide a modeling method, a modeling apparatus and a computer-readable storage medium, which can extract, with a high precision, the parameters that are used to analyze the high-frequency transmission, and can considerably reduce the analysis time for the extraction.

Still another object of the present invention is to provide a modeling method of creating a three-dimensional analysis model of a target object for extracting parameters that are used to analyze a high-frequency transmission, comprising a selecting step selecting, from an art work data of the target object, an extraction target region that becomes a target for extracting the parameters that are used to analyze the high-frequency transmission; a deleting step deleting non-extraction target elements of the extraction target region, that do not affect an electromagnetic analysis and are other than extraction target elements that affect the electromagnetic analysis; a linearizing step linearizing, from among the extraction target element, a curved wiring; and an optimizing step optimizing a wiring length of the extraction target region including the linearized wiring and optimizing an analyzing space dimension of the extraction target region, so as to create the three-dimensional analysis mode. According to the modeling method of the present invention, it is possible to extract, with a high precision, the parameters that are used to analyze the high-frequency transmission, and to considerably reduce the analysis time for the extraction.

A further object of the present invention is to provide a modeling apparatus configured to create a three-dimensional analysis model of a target object for extracting parameters that are used to analyze a high-frequency transmission, comprising a selecting part configured to select, from an art work data of the target object, an extraction target region that becomes a target for extracting the parameters that are used to analyze the high-frequency transmission; a deleting part configured to delete non-extraction target elements of the extraction target region, that do not affect an electromagnetic analysis and are other than extraction target elements that affect the electromagnetic analysis; a linearizing part configured to linearize, from among the extraction target element, a curved wiring; and an optimizing part configured to optimize a wiring length of the extraction target region including the linearized wiring and optimizing an analyzing space dimension of the extraction target region, so as to create the three-dimensional analysis mode. According to the modeling apparatus of the present invention, it is possible to extract, with a high precision, the parameters that are used to analyze the high-frequency transmission, and to considerably reduce the analysis time for the extraction.

Another object of the present invention is to provide a computer-readable storage medium which stores a program for causing a computer to create a three-dimensional analysis model of a target object for extracting parameters that are used to analyze a high-frequency transmission, the program comprising a selecting procedure causing the computer to select, from an art work data of the target object, an extraction target region that becomes a target for extracting the parameters that are used to analyze the high-frequency transmission; a deleting procedure causing the computer to delete non-extraction target elements of the extraction target region, that do not affect an electromagnetic analysis and are other than extraction target elements that affect the electromagnetic analysis; a linearizing procedure causing the computer to linearize, from among the extraction target element, a curved wiring; and an optimizing procedure causing the computer to optimize a wiring length of the extraction target region including the linearized wiring and optimizing an analyzing space dimension of the extraction target region, so as to create the three-dimensional analysis mode. According to the computer-readable storage medium of the present invention, it is possible to extract, with a high precision, the parameters that are used to analyze the high-frequency transmission, and to considerably reduce the analysis time for the extraction.

Other objects and further features of the present invention will be apparent from the following detailed description when read in conjunction with the accompanying drawings.

DESCRIPTION OF THE PREFERRED EMBODIMENTS

Figure 1:
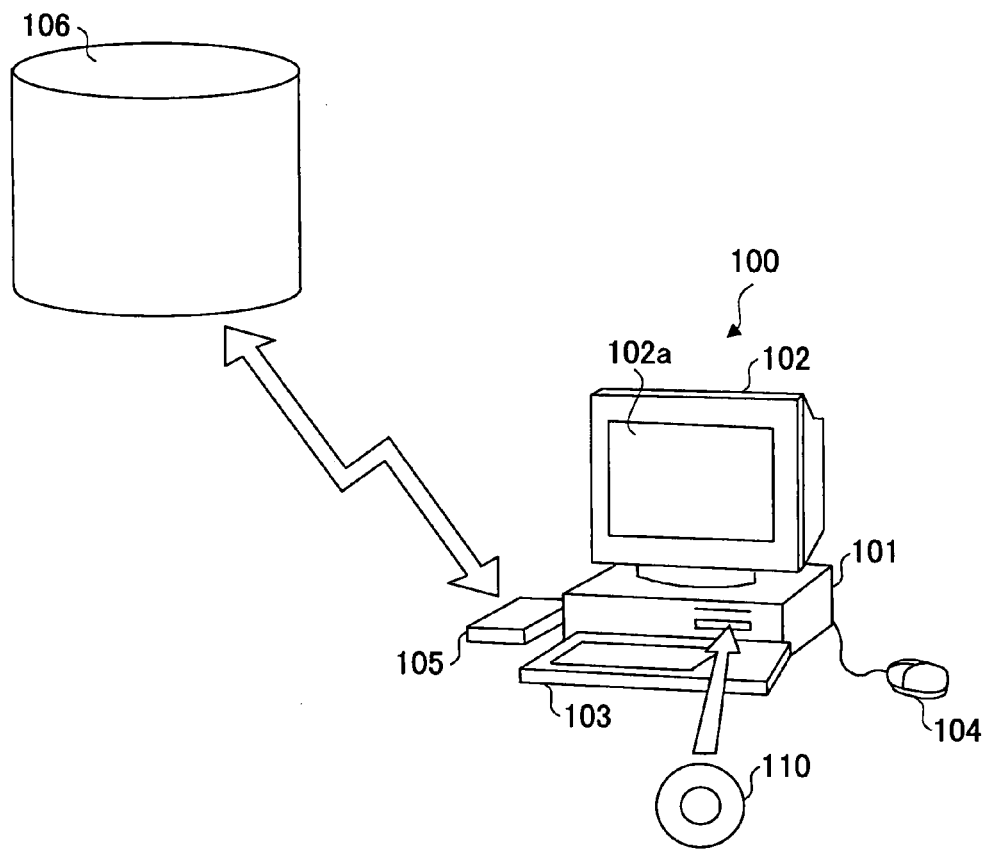
FIG. 1 is a perspective view showing a computer system to which the present invention is applied in an embodiment of a modeling apparatus according to the present invention.

A description will be given of embodiments of the modeling method, the modeling apparatus and the computer-readable storage medium according to the present invention, by referring to the drawings.

An embodiment of the modeling apparatus according to the present invention may employ an embodiment of the modeling method according to the present invention and may employ an embodiment of the computer-readable storage medium according to the present invention. FIG. 1 is a perspective view showing a computer system to which the present invention is applied in this embodiment of the modeling apparatus according to the present invention.

A computer system 100 shown in FIG. 1 has a main body 101 having a built-in CPU, disk drive and the like, a display 102 for displaying an image on a display screen 102a in response to an instruction received from the main body 101, a keyboard 103 for inputting various information to the computer system 100, a mouse 104 for specifying an arbitrary position on the display screen 102a of the display 102, and a modem 105 for accessing an external database or the like and for downloading programs and the like stored in other computer systems.

A program (modeling software or tool) for causing the computer system 100 to have at least a modeling function, is input to the computer system 100 and compiled therein. This program of the present invention may be stored in a portable recording medium such as a disk 110 or, downloaded from a recording medium 106 of another computer system using a communication apparatus such as the modem 105. This program may be stored in this embodiment of the computer-readable storage medium, such as the disk 110. The computer-readable storage medium is not limited to portable recording media such as the disk 110, IC card memories, magnetic disks such as floppy disks, magneto-optical disks and CD-ROMs, and includes various recording media that are accessible by a computer system which is connected to the computer system 100 via the communication apparatus or communication means such as the modem 105 and the LAN.

Figure 2:
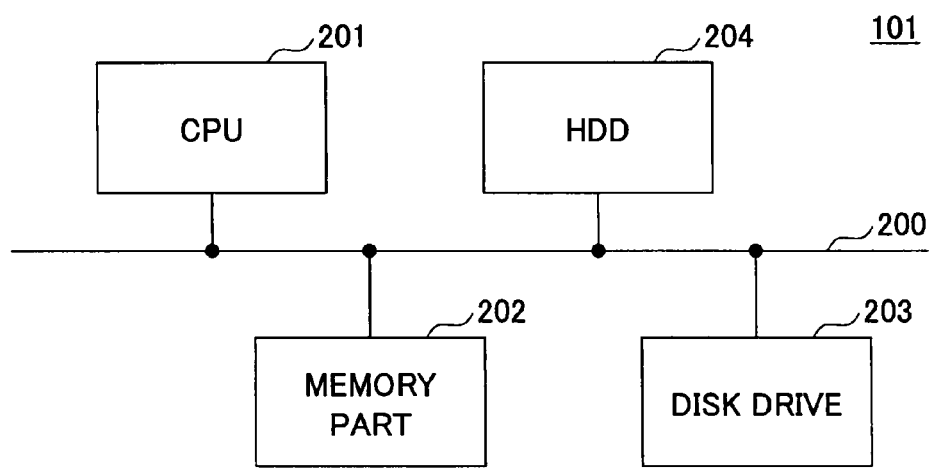
FIG. 2 is a system block diagram for explaining a structure of an important part within a main body of the computer system.

FIG. 2 is a system block diagram showing a structure of an important part of the main body 101 within the computer system 100. The main body 101 has the CPU 201, a memory part 202 made up of a RAM, a ROM and the like, a disk drive 203 for the disk 110, and a Hard Disk Drive (HDD) 204 that are connected via a bus 200. In this embodiment, the display 102, the keyboard 103 and the mouse 104 are also connected to the CPU 201 via the bus 200, however, each of the display 102, the keyboard 103 and the mouse 104 may be connected directly to the CPU 201. In addition, the display 102 may be connected to the CPU 201 via a known graphic interface (not shown) which processes input and output image data.

The structure of the computer system 100 is of course not limited to the structure shown in FIGS. 1 and 2, and a computer system having any known suitable structure may be used in place of the computer system 100.

Figure 3:
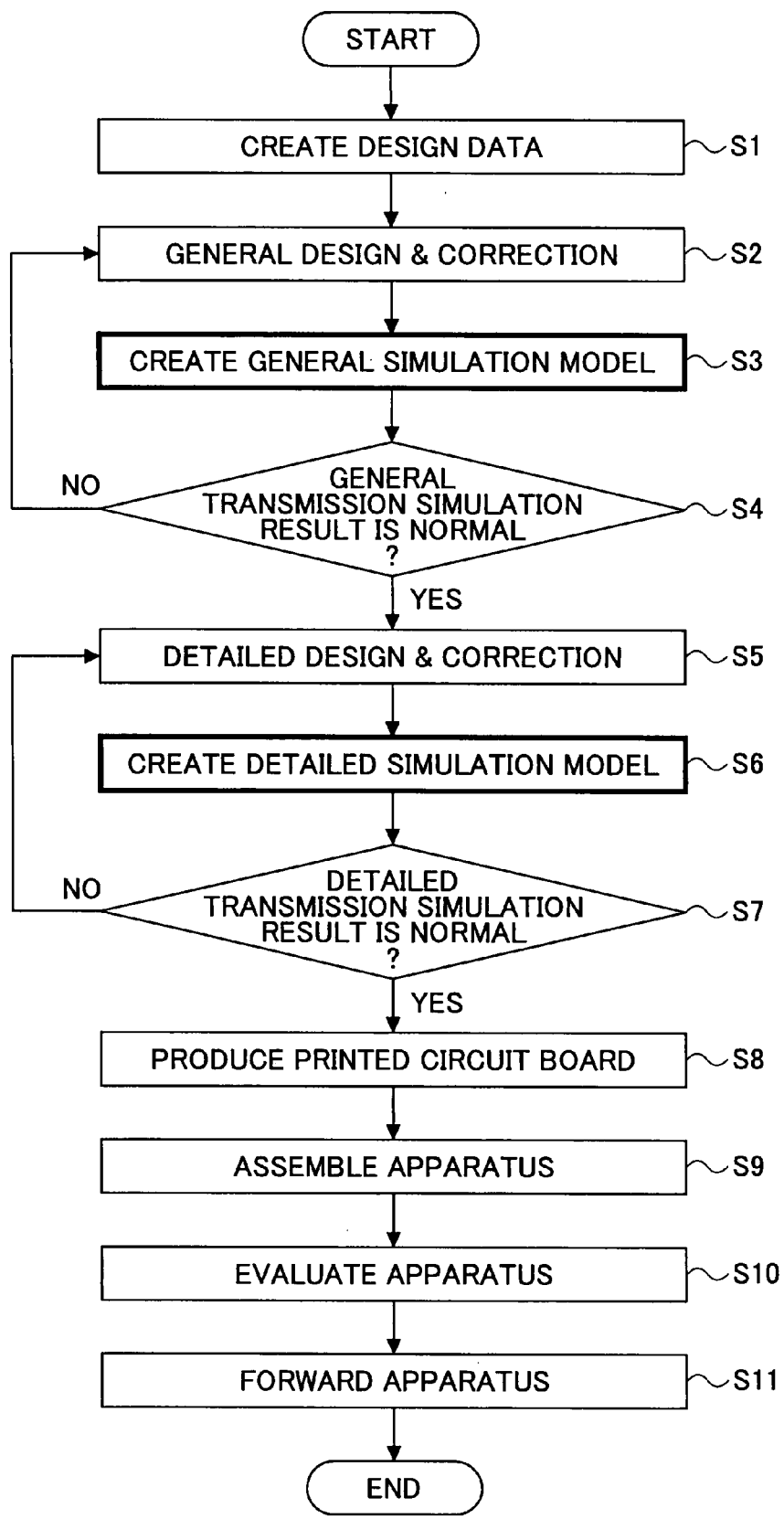
FIG. 3 is a flow chart for generally explaining a series of processes from design, production and up to forwarding of a printed circuit board, for example.

FIG. 3 is a flow chart for generally explaining a series of processes from design, production and up to forwarding of a printed circuit board, for example. The processes of steps S1 through S7 are executed by the CPU 201 with respect to the printed circuit board, that is, the target object.

In FIG. 3, a step S1 creates a design data of the printed circuit board that is to be produced, by the CPU 201, and stores the design data in the memory part 202, for example. A step S2 carries out a general design of the art work data, including the wirings and the layout of the elements, by the CPU 201, based on the design data, and stores general art work data in the memory part 202. A step S3 generates a general simulation model by the CPU 201, based on the general art work data that is designed in the step S2 or, the general art work data that is modified as will be described later, and stores the general simulation model in the memory part 202. A step S4 carries out a general art work transmission simulation by the CPU 201, based on the general simulation model created in the step S3, and decides whether or not a general simulation result is normal or acceptable (that is, free of abnormality). If the decision result in the step S4 is NO, the process returns to the step S2, and the general art work data is corrected depending on an input that is made by the operator, for example, so that the normal or acceptable general simulation result can be obtained.

On the other hand, if the decision result in the step S4 is YES, a step S5 carries out a detailed design of the art work data by the CPU 201, based on the general art work data obtained by the step S2, and stores the detailed art work data in the memory part 202. A step S6 generates a detailed simulation model by the CPU 201, based on the detailed art work data that is designed in the step S5 or, the detailed art work data that is modified as will be described later, and stores the detailed simulation model in the memory part 202. A step S7 carries out a detailed art work transmission simulation by the CPU 201, based on the detailed simulation model created in the step S6, and decides whether or not a detailed simulation result is normal or acceptable (that is, free of abnormality). If the decision result in the step S7 is NO, the process returns to the step S5, and the detailed art work data is corrected depending on an input that is made by the operator, for example, so that the normal or acceptable detailed simulation result can be obtained.

If the decision result in the step S7 is YES, a step S8 produces the printed circuit board by a producing apparatus (not shown) based on the detailed simulation model that is judged as being normal or acceptable. A step S9 assembles an arbitrary apparatus using the printed circuit board that is produced, using an assembling apparatus (not shown). A step S10 evaluates the assembled apparatus by a known method using a testing apparatus (not shown). When the assembled apparatus is evaluated as being normal or acceptable in the step S10, a step S11 forwards the assembled apparatus, and the process ends.

Figure 4:
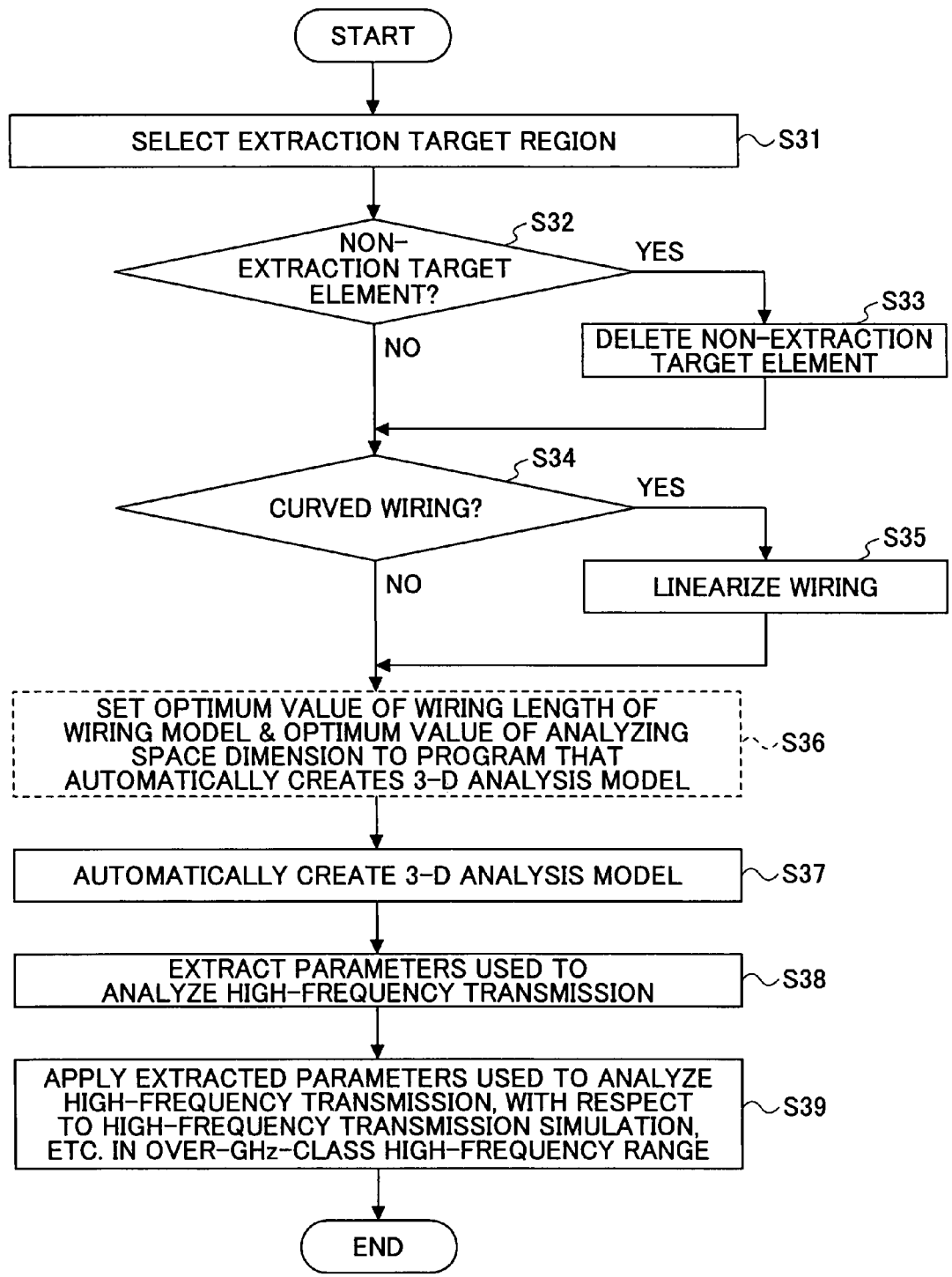
FIG. 4 is a flow chart for explaining an important part of the process shown in FIG. 3.

The present invention is particularly characterized by the processes of the steps S3 and S6. FIG. 4 is a flow chart for explaining an important part of the process shown in FIG. 3, that is, the process of the step S3 or S6.

Figure 5:
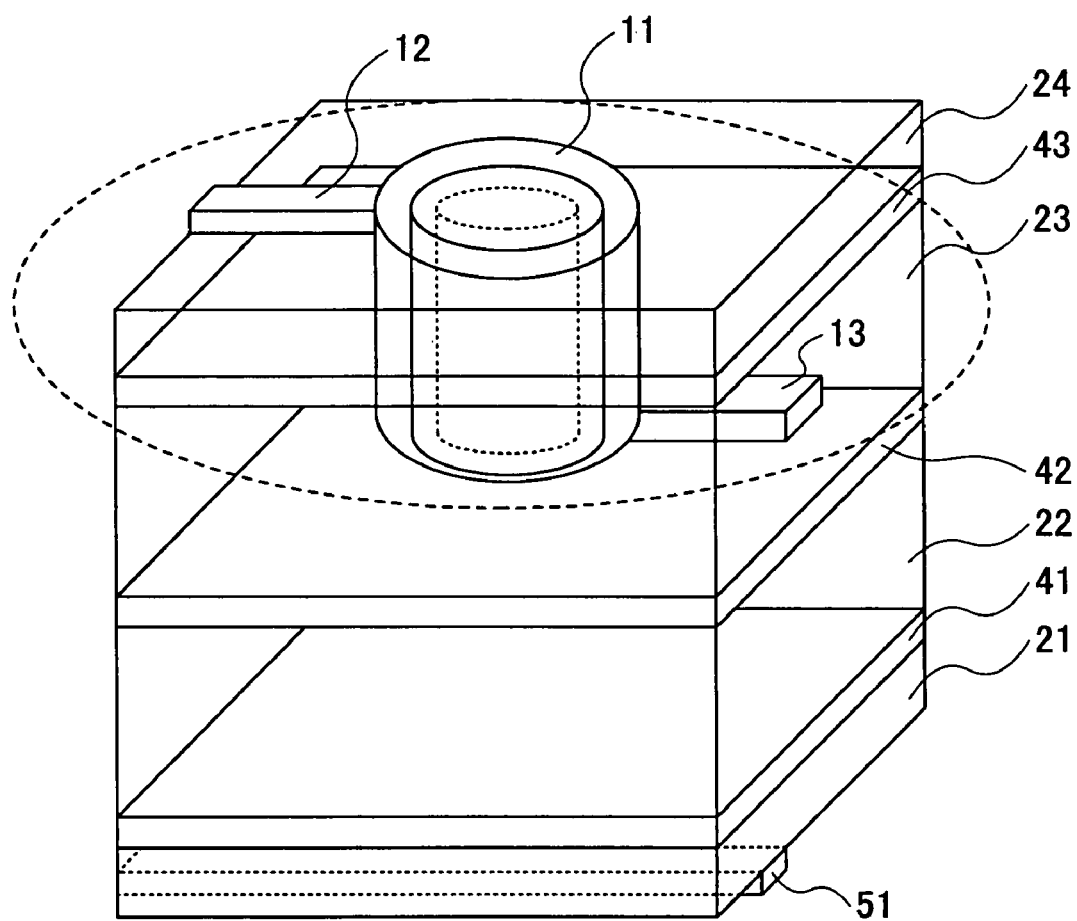
FIG. 5 is a perspective view showing an extraction target region.

In FIG. 4, a step S31 selects, from the art work data, an extraction target region shown in FIG. 5 that becomes a target from which parameters that are used to analyze the high-frequency transmission (S-parameters), and stores the selected extraction target region in the memory part 202. The selection of the extraction target region may be made based on an input made by the operator or, made automatically in succession by the CPU 201. FIG. 5 is a perspective view showing the extraction target region. The extraction target region shown in FIG. 5 includes extraction target elements and non-extraction target elements that are excluded from the extraction target. FIG. 5 shows a case where the extraction target elements include a via 11, wirings 12 and 13, insulator layers 21, 22, 23 and 24, and power or ground layers 41, 42 and 43, and the non-extraction target elements includes a wiring 51. One of the insulator layers 41, 42 and 43 may be a substrate. A step S32 decides whether or not a non-extraction target element, such as a wiring and a pad, other than the extraction target element for extracting the parameters that are used to analyze the high-frequency transmission (S-parameters), such as a via and a wiring, exists within the selected extraction target region.

Figure 6:
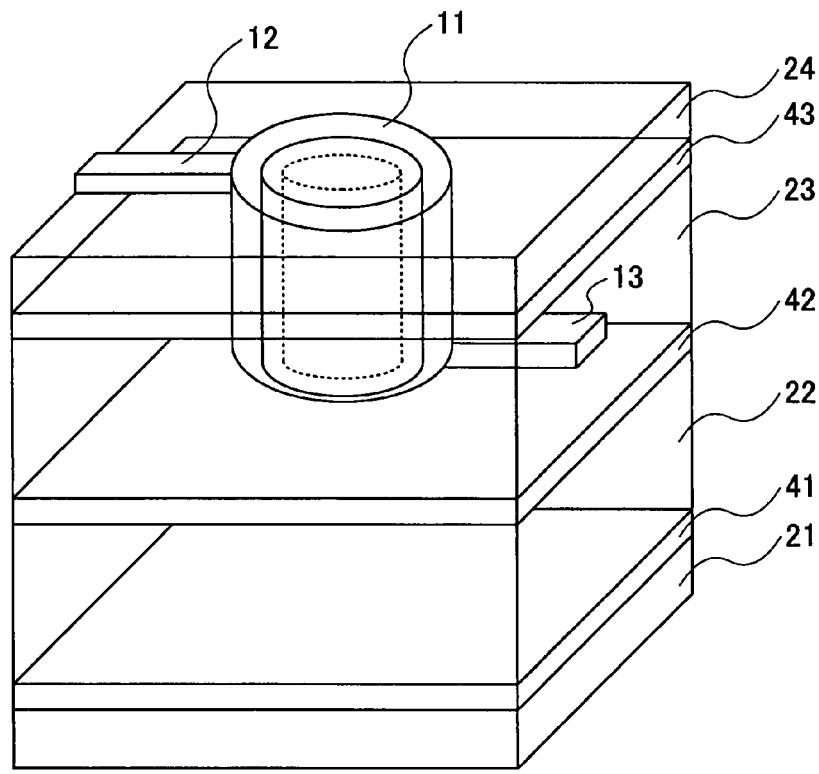
FIG. 6 is a perspective view showing the extraction target region after deletion of elements other than extraction target elements.

If the decision result in the step S32 is YES, a step S33 automatically deletes the elements that are other than the extraction target elements and are located within the selected extraction target region, as shown in FIG. 6, and stores the extraction target region after this deletion in the memory part 202. FIG. 6 is a perspective view showing the extraction target region after the deletion of the elements other than the extraction target elements. In this embodiment, the extraction target elements include the wirings, the pads, the vias and the like that affect the electromagnetic analysis. On the other hand, the wirings, the pads, the vias and the like that are isolated from the extraction target element by the power or ground layer and do not affect the electromagnetic analysis are deleted as the non-extraction target elements. Accordingly, the wiring 51 shown in FIG. 5, that is the non-extraction target element, is deleted as shown in FIG. 6.

After the step S33 or, if the decision result in the step S32 is NO, a step S34 decides whether or not a curved wiring exists within the selected extraction target region. If the decision result in the step S34 is YES, a step S35 linearizes (or rectifies) the curved wiring and stores the extraction target region in the memory part 202. The linearization (or rectification) of the wiring will be described later in conjunction with FIG. 7.

After the step S35 or, if the decision result in the step S34 is NO, a step S36 stores an optimum value of a wiring length of a wiring model and an optimum value of an analyzing space dimension of the extraction target region, that is, an extraction target element model, in the memory part 202, for example, based on an evaluation performed in advance or the like, so as to set these optimum values within a program that automatically creates a three-dimensional (3-D) analysis model (3-D analysis model automatic creating program) for extracting the parameters that are used to analyze the high-frequency transmission. The step S36 does not need to be executed at the timing shown in FIG. 4, and may executed in advance at an arbitrary timing, for example, so that the optimum value of the wiring length of the wiring model and the optimum value of the analyzing space dimension are set in advance within the 3-D analysis model automatic creating program for extracting the parameters that are used to analyze the high-frequency transmission.

A step S37 automatically generates a three-dimensional (3-D) analysis model for extracting the parameters that are used to analyze the high-frequency transmission by the 3-D analysis model automatic creating program, based on the optimized extraction target element model having the wiring that is linearized and the wiring length that is optimized and the optimized analyzing space dimension, and stores the generated 3-D analysis model in the memory part 202. A step S38 extracts the parameters that are used to analyze the high-frequency transmission, by analyzing the 3-D analysis model for extracting the parameters that are used to analyze the high-frequency transmission, and stores the extracted parameters in the memory part 202. In addition, a step S39 applies the extracted parameters that are used to analyze the high-frequency transmission, with respect to a high-frequency transmission simulation or the like in an over-GHz-class high-frequency range, and the process returns to the step S4 shown in FIG. 3 if the process shown in FIG. 4 is the process of the step S3, and the process returns to the step S7 shown in FIG. 3 if the process shown in FIG. 4 is the process of the step S6.

Figure 7:
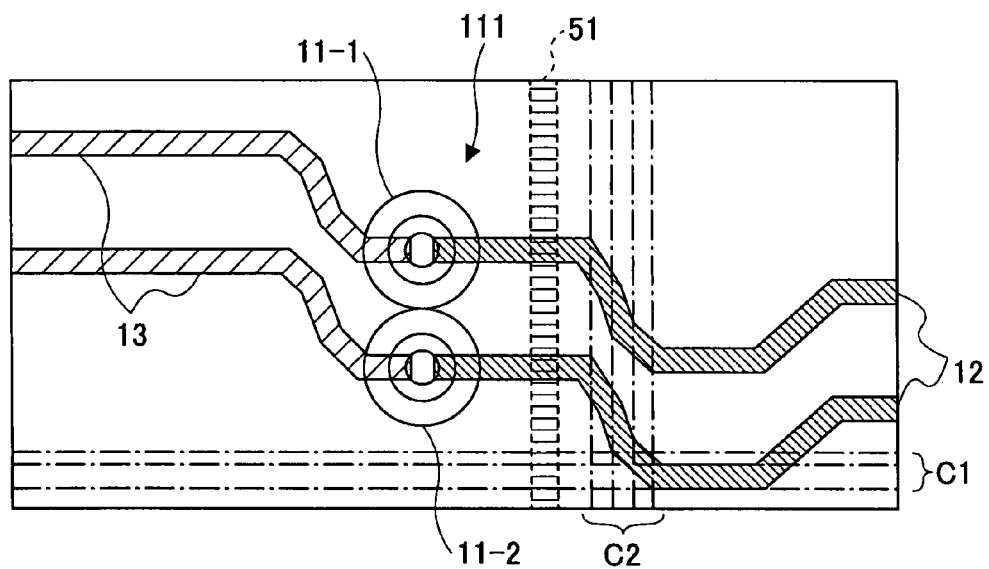
FIG. 7 is a diagram showing a three-dimensional analysis model for extracting parameters that are used to analyze a high-frequency transmission and are extracted from art work data.

FIG. 7 is a diagram showing the 3-D analysis model for extracting the parameters that are used to analyze the high-frequency transmission and are extracted from the art work data. FIG. 7 shows the 3-D analysis model that is obtained by extracting a via portion 111 that includes two vias 11-1 and 11-2, within an arbitrary range, from the art work data. But in this case, the shape of the wiring portion is extremely complex, and meshes of curved portions of the wirings 12 and 13 becomes segmented at each corner as indicated by C1 and C2 in FIG. 7 to thereby generate extremely small meshes or micromeshes. In addition, because the analyzing space is not appropriate, it is difficult to extract the parameters that are used to analyze the high-frequency transmission with a high precision. In FIG. 7, the wiring 12 is provided on a surface layer, and the wiring 13 is provided on an inner (or internal) layer. In addition, a wiring 51 is provided on an inner (or internal) layer other than the inner layer on which the wiring 13 is provided, and this wiring 51 a non-extraction target element that does not affect the electromagnetic analysis of the wirings 12 and 13.

Figure 8:
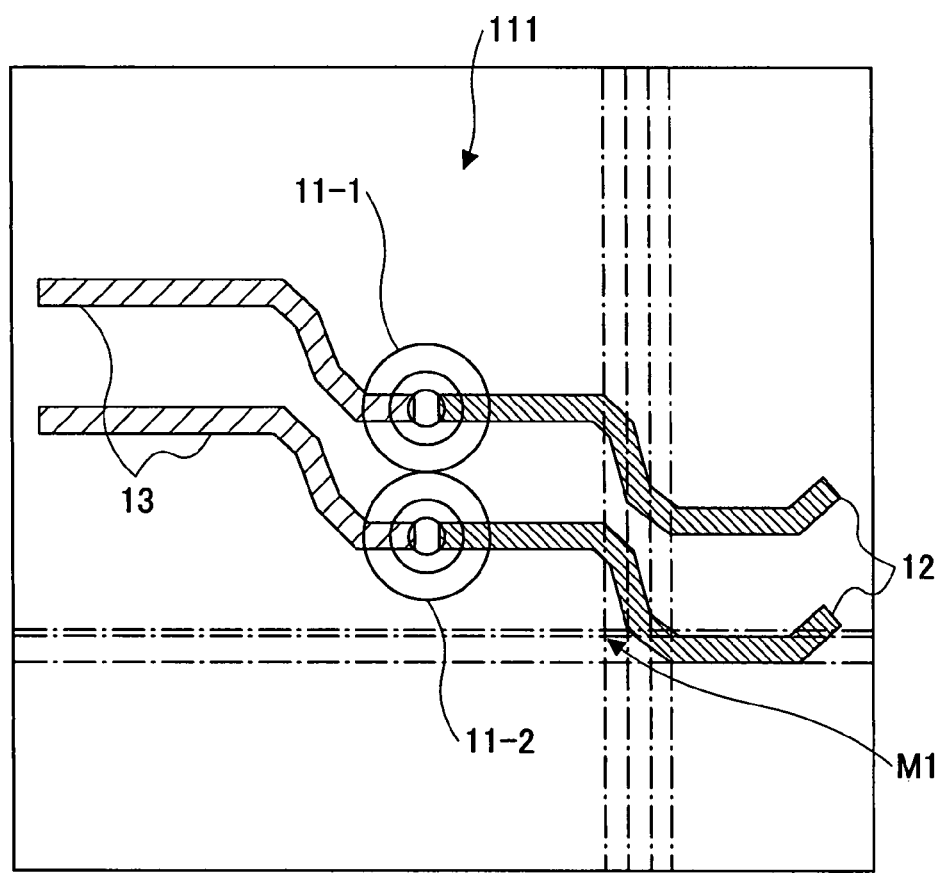
FIG. 8 is a diagram showing a three-dimensional analysis model for extracting the parameters that are used to analyze the high-frequency transmission, in which only an analyzing space shown in FIG. 7 is optimized.
Figure 9:
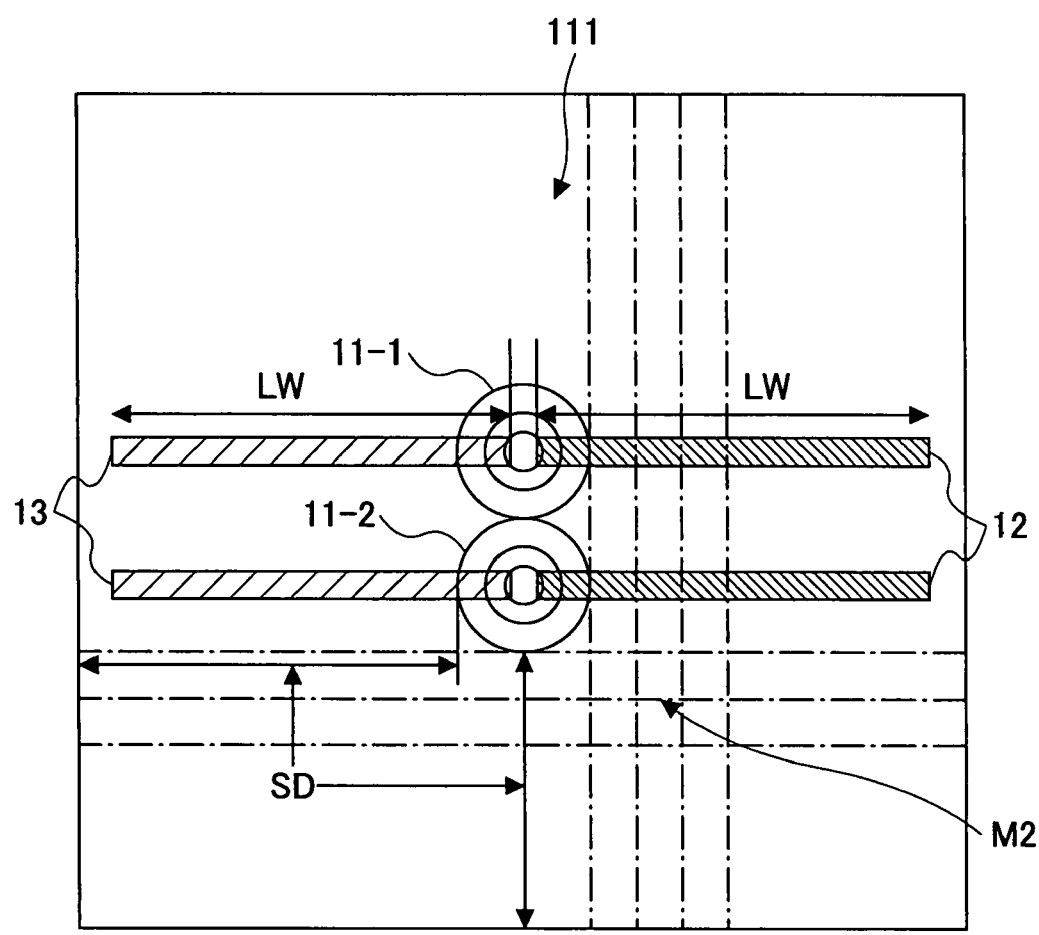
FIG. 9 is a diagram showing a three-dimensional analysis model for extracting the parameters that are used for analyzing the high-frequency transmission after total optimization.

Therefore, as the segmenting of the meshes becomes smaller, the analysis time becomes longer. Consequently, even if only the analyzing space is optimized as shown in FIG. 8, micromeshes remain as they are, as indicated by M1, for example, and an extremely long analysis time will be required. FIG. 8 is a diagram showing a 3-D analysis model for extracting the parameters that are used to analyze the high-frequency transmission, in which only the analyzing space shown in FIG. 7 is optimized. In FIG. 8 and FIG. 9 which will be described later, the analyzing space in a direction taken along the thickness of the printed circuit board is also optimized in the 3-D analysis model shown.

In order to maintain the analyzing precision and to greatly reduce the analysis time, this embodiment linearizes the wirings 12 and 13 of a wiring model shown in FIG. 9, optimizes the wiring length, and optimizes the analyzing space dimension, so as to maintain the approximately the same precision for extracting the parameters that are used to analyze the high-frequency transmission as in the case shown in FIG. 8, and to also enable a considerable reduction in the analysis time for extracting the parameters. FIG. 9 is a diagram showing a 3-D analysis model for extracting the parameters that are used for analyzing the high-frequency transmission after total optimization that includes the linearization of the wiring of the wiring model, the optimization of the wiring length and the optimization of the analyzing space dimension. In FIG. 9, LW denotes an optimized wiring length of the wiring 12 that is linearized, and SD denotes an optimized analyzing space dimension. As indicated by M2 in FIG. 9, no micromesh is generated, to thereby enable a considerable reduction in the analysis time without deteriorating the analyzing precision. The wirings 12 and 13 that are used in this particular case are for use in making connections to electrodes that are essential for the electromagnetic analysis. The optimization of the wiring portion including the wirings 12 and 13 is also essential for the extraction of the parameters that are used to analyze the high-frequency transmission.

When the 3-D analysis model for extracting the parameters that are used to analyze the high-frequency transmission, shown in FIG. 8, in which only the analyzing space is optimized, and the 3-D analysis model for extracting the parameters that are used to analyze the high-frequency transmission, shown in FIG. 9, in which the wiring model is also optimized (linearization of the wiring and optimization of the wiring length) in addition to the analyzing space, are compared, it may be seen that the parameters that can be extracted have similar characteristics and can used to analyze the high-frequency transmission with a high precision. However, the analysis time required to extract the parameters that are used to analyze the high-frequency transmission is approximately 264 hours (approximately 11 days) for the 3-D analysis model shown in FIG. 8, while the analysis time required to extract the parameters that are used to analyze the high-frequency transmission is approximately 18 hours (approximately 0.75 days) for the 3-D analysis model shown in FIG. 9, for example. Hence, it was confirmed that the 3-D analysis model shown in FIG. 9 can reduce the analysis time to approximately $1/15$ the analysis time required by the 3-D analysis model shown in FIG. 8, and that a high-speed analysis is possible using the 3-D analysis model shown in FIG. 9. The extracted parameters that are used to analyze the high-frequency transmission (S-parameters) are shown in FIGS. 10 and 11, and a high-speed transmission simulation waveform obtained by applying these parameters that are used to analyze the high-frequency transmission is shown in FIG. 12.

Figure 10:
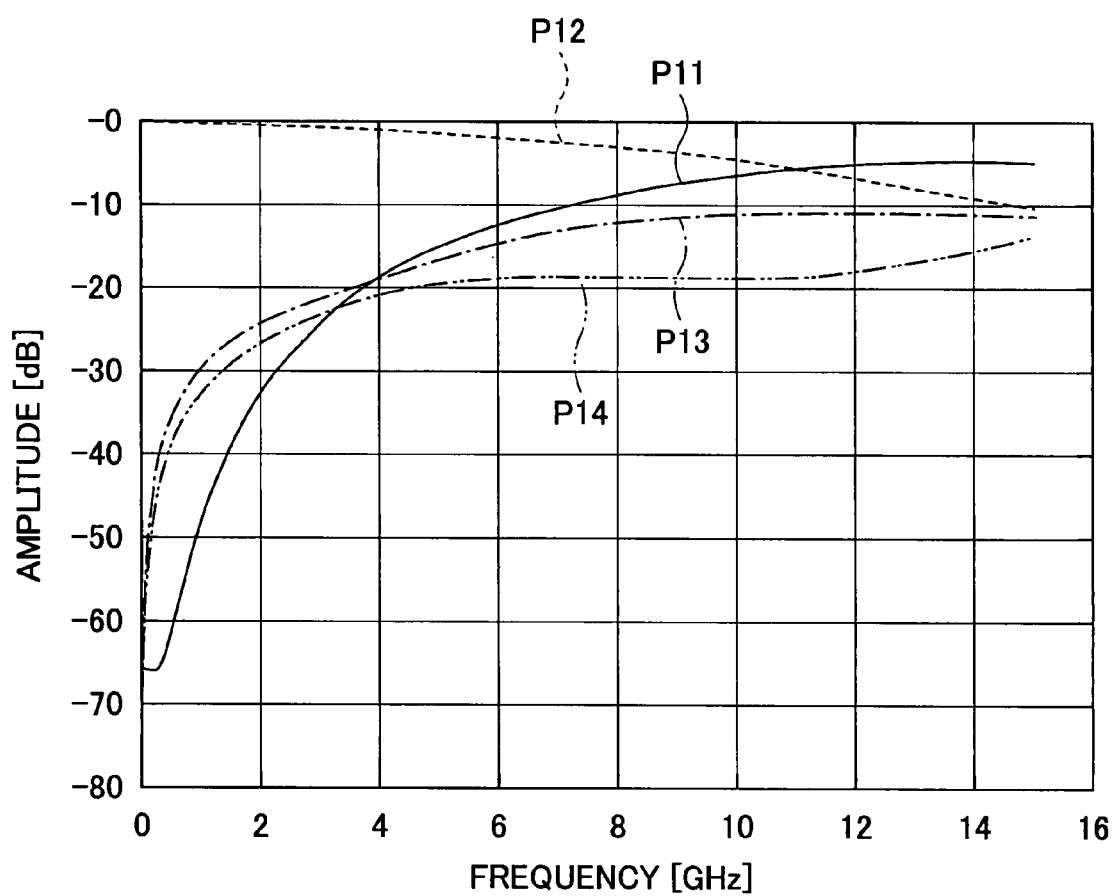
FIG. 10 is a diagram showing an amplitude characteristic that is extracted.
Figure 11:
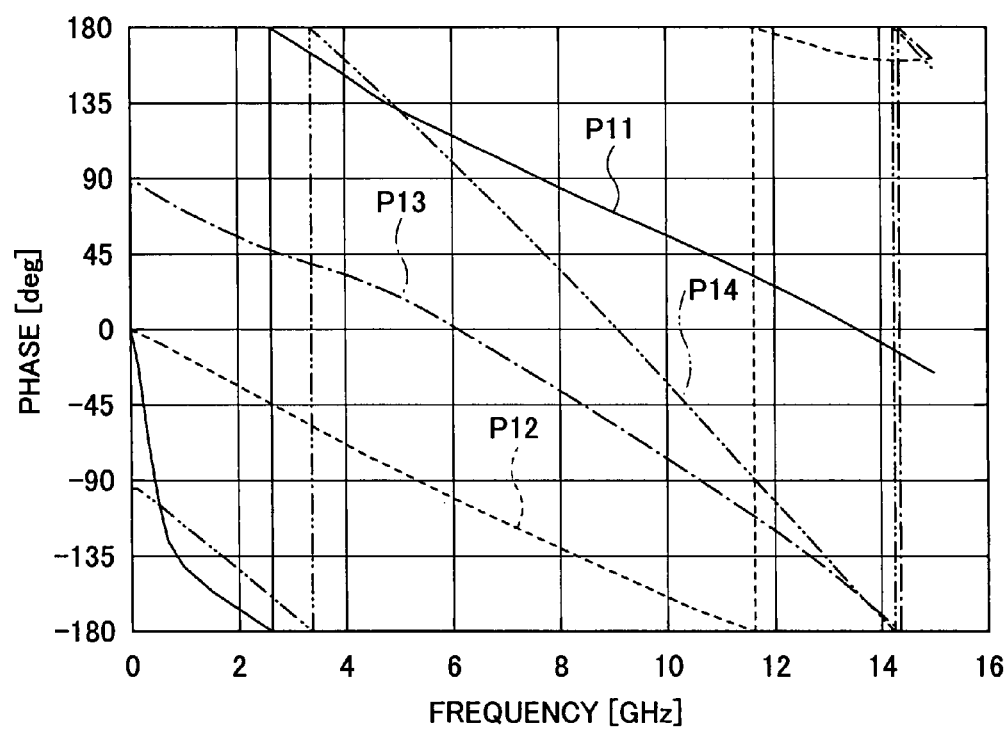
FIG. 11 is a diagram showing a phase characteristic that is extracted.

FIG. 10 is a diagram showing an amplitude characteristic that is extracted, and FIG. 11 is a diagram showing a phase characteristic that is extracted. In FIGS. 10 and 11, P11 denotes a reflection characteristic of a first port of the 3-D analysis model for extracting the parameters that are used to analyze the high-frequency transmission, P12 denotes a transmission characteristic of this 3-D analysis model from the first port to a second port, and P13 denotes a crosstalk characteristic of this 3-D analysis model from the first port to a third port, and P14 denotes a crosstalk characteristic of this 3-D analysis model from the first port to a fourth port.

Figure 12:
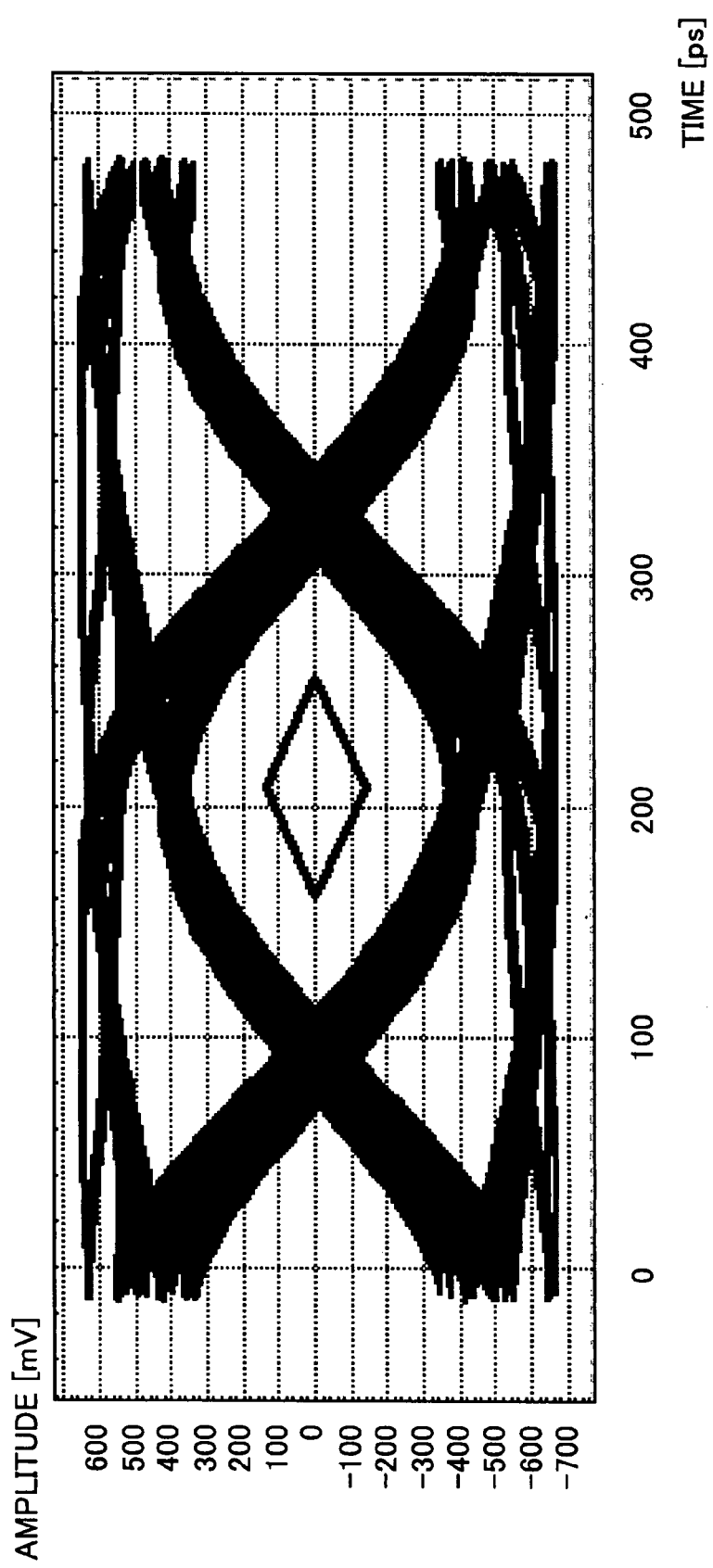
FIG. 12 is a diagram showing a high-frequency transmission simulation waveform that is obtained and using extracted S-parameters.

In addition, FIG. 12 is a diagram showing the high-frequency transmission simulation waveform that is obtained using the extracted S-parameters. The waveform shown in FIG. 12 is a simulation result obtained by carrying out a transient analysis using the S-parameters which are extracted from the 3-D analysis model for extracting the parameters that are used to analyze the high-frequency transmission. In FIG. 12, the ordinate indicates the signal amplitude, and the abscissa indicates the time.

The above described case uses the vias, but the present invention can similarly be applied to the pads. It was confirmed that results similar to those obtained for the vias described above are obtained for the pads, when the via portion shown in FIGS. 8 and 9 are replaced by a pad portion.

By automatically optimizing the analyzing space and the element model for extracting the parameters that are used to analyze the high-frequency transmission, such as the S-parameters in the case of the described embodiment, the present invention can maintain the extraction precision of the parameters that are used to analyze the high-frequency transmission and also greatly reduce the analysis time. For this reason, as the operation frequency of the apparatuses becomes higher, it becomes possible to greatly contribute to the simulation of the over-GHz-class transmission that is being more popularly applied to the apparatuses.

Therefore, the present invention is applicable to the case where a high-precision simulation is carried out at the over-GHz-class frequency range, based on the art work data of the printed circuit board or the like.

Further, the present invention is not limited to these embodiments, but various variations and modifications may be made without departing from the scope of the present invention.

What is claimed is:
1. A modeling method comprising:
    selecting a portion of an art work data of a target object having elements, said portion forming an extraction target region that becomes a target for extracting parameters to be used to analyze a high-frequency transmission, said art work data including a layout of the elements of the target object;
    deleting non-extraction target elements within the extraction target region, that are isolated from extraction target elements within the extraction target region by a power or ground layer and do not affect an electromagnetic analysis of the elements, said extraction target elements being elements that are to be extracted and affect the electromagnetic analysis;

linearizing, from among the extraction target elements, a curved wiring;

optimizing a wiring length of the extraction target region including the linearized wiring and optimizing an analyzing space dimension of the extraction target region, in order to create a three-dimensional analysis model of the target object; and extracting the parameters by analyzing the three-dimensional analysis model.

2. The modeling method as claimed in claim 1, wherein an optimum value of the wiring length and an optimum value of the analyzing space dimension are set in advance.

3. The modeling method as claimed in claim 1, wherein the selecting the extraction target region, the deleting the non-extraction target elements, the linearizing the curved wiring and the optimizing the wiring length of the extraction target region are carried out when creating a general simulation model that is used for a general art work transmission simulation.

4. The modeling method as claimed in claim 1, wherein the selecting the extraction target region, the deleting the non-extraction target elements, the linearizing the curved wiring and the optimizing the wiring length of the extraction target region are carried out when creating a detailed simulation model that is used for a detailed art work transmission simulation.

5. The modeling method as claimed in claim 1, wherein the target object is a printed circuit board, and the extraction target elements and the non-extraction target elements are both selected from a group consisting of a wiring, a pad and a via.

6. The modeling method as claimed in claim 1, wherein the linearizing linearizes the curved wiring in which each curved portion is represented by micromeshes.

7. A modeling apparatus comprising:

a processor configured to create a three-dimensional analysis model of a target object having elements in order to extract from the three-dimensional analysis model parameters to be used to analyze a high-frequency transmission, said processor executing a program to function as:
a selecting part configured to select a portion of an art work data of the target object, said portion forming an extraction target region that becomes a target for extracting the parameters, said art work data including a layout of the elements of the target object;

a deleting part configured to delete non-extraction target elements within the extraction target region, that are isolated from extraction target elements within the extraction target region by a power or ground layer and do not affect an electromagnetic analysis of the elements, said extraction target elements being elements that are to be extracted and affect the electromagnetic analysis;

a linearizing part configured to linearize, from among the extraction target elements, a curved wiring;

an optimizing part configured to optimize a wiring length of the extraction target region including the linearized wiring and optimizing an analyzing space dimension of the extraction target region, in order to create the three-dimensional analysis model; and an extracting part configured to extract the parameters by analyzing the three-dimensional analysis model.

8. The modeling apparatus as claimed in claim 7, wherein an optimum value of the wiring length and an optimum value of the analyzing space dimension are set in advance.

9. The modeling apparatus as claimed in claim 7, wherein the selecting part, the deleting part, the linearizing part and the optimizing part carry out respective processes when creating a general simulation model that is used for a general art work transmission simulation.

10. The modeling apparatus as claimed in claim 7, wherein the selecting part, the deleting part, the linearizing part and the optimizing part carry out respective processes when creating a detailed simulation model that is used for a detailed art work transmission simulation.

11. The modeling apparatus as claimed in claim 7, wherein the target object is a printed circuit board, and the extraction target elements and the non-extraction target elements are both selected from a group consisting of a wiring, a pad and a via.

12. The modeling apparatus as claimed in claim 7, wherein the linearizing part linearizes the curved wiring in which each curved portion is represented by micromeshes.

13. A non-transitory computer-readable storage medium storing a program which, when executed by a computer, causes the computer to perform a process to create a three-dimensional analysis model of a target object having elements, said process comprising:

a selecting procedure causing the computer to select a portion of an art work data of the target object, said portion forming an extraction target region that becomes a target for extracting parameters to be used to analyze a high-frequency transmission, said art work data including a layout of the elements of the target object;

a deleting procedure causing the computer to delete non-extraction target elements within the extraction target region, that are isolated from extraction target elements within the extraction target region by a power or ground layer and do not affect an electromagnetic analysis of the elements, said extraction target elements being elements that are to be extracted and affect the electromagnetic analysis;

a linearizing procedure causing the computer to linearize, from among the extraction target elements, a curved wiring;

an optimizing procedure causing the computer to optimize a wiring length of the extraction target region including the linearized wiring and optimizing an analyzing space dimension of the extraction target region, in order to create the three-dimensional analysis model; and an extracting procedure causing the computer to extract the parameters by analyzing the three-dimensional analysis model.

14. The computer-readable storage medium as claimed in claim 13, wherein an optimum value of the wiring length and an optimum value of the analyzing space dimension are set in advance.

15. The computer-readable storage medium as claimed in claim 13, wherein the selecting procedure, the deleting procedure, the linearizing procedure and the optimizing procedure cause the computer to carry out respective processes when creating a general simulation model that is used for a general art work transmission simulation.

16. The computer-readable storage medium as claimed in claim 13, wherein the selecting procedure, the deleting procedure, the linearizing procedure and the optimizing procedure cause the computer to carry out respective processes when creating a detailed simulation model that is used for a detailed art work transmission simulation.

17. The computer-readable storage medium as claimed in claim 13, wherein the linearizing procedure causes the computer to linearize the curved wiring in which each curved portion is represented by micromeshes.

* * * * *